(12) United States Patent
Peng et al.

(10) Patent No.: US 11,710,962 B2
(45) Date of Patent: *Jul. 25, 2023

(54) DEVICE AND METHOD FOR OPERATING THE SAME

(71) Applicant: TAIWAN SEMICONDUCTOR MANUFACTURING CO., LTD., Hsinchu (TW)

(72) Inventors: Po-Lin Peng, Taoyuan (TW); Yu-Ti Su, Tainan (TW); Chia-Wei Hsu, New Taipei (TW); Ming-Fu Tsai, Hsinchu (TW); Shu-Yu Su, Hsinchu (TW); Li-Wei Chu, Hsinchu (TW); Jam-Wem Lee, Hsinchu (TW); Chia-Jung Chang, Hsinchu (TW); Hsiang-Hui Cheng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/827,776

(22) Filed: May 29, 2022

(65) Prior Publication Data

US 2022/0294212 A1    Sep. 15, 2022

Related U.S. Application Data

(63) Continuation of application No. 16/936,236, filed on Jul. 22, 2020, now Pat. No. 11,355,927.

(51) Int. Cl.
*H02H 9/04* (2006.01)
*G01R 31/00* (2006.01)
*H02H 1/00* (2006.01)

(52) U.S. Cl.
CPC .......... *H02H 9/046* (2013.01); *G01R 31/001* (2013.01); *H02H 1/0007* (2013.01)

(58) Field of Classification Search
CPC ..... H02H 9/046; H02H 1/0007; G01R 31/001
(Continued)

(56) References Cited

U.S. PATENT DOCUMENTS 5,828,607 A * 10/1998 Bushey ................. G11C 16/30
365/189.11
5,966,026 A * 10/1999 Partovi .............. H03K 19/0136
326/27

(Continued)

FOREIGN PATENT DOCUMENTS

| TW | 201533880 A | 9/2015 |
| TW | 201619777 A | 6/2016 |
| TW | 201742345 A | 12/2017 |

*Primary Examiner* — Dharti H Patel
(74) *Attorney, Agent, or Firm* — Maschoff Brennan

(57) ABSTRACT

A device is disclosed herein. The device includes a bias generator, an ESD driver, and a logic circuit. The bias generator includes a first transistor. The ESD driver includes a second transistor and a third transistor coupled to each other in series. The logic circuit is configured to generate a logic control signal. A first terminal of the first transistor is configured to receive a reference voltage signal, a control terminal of the first transistor is configured to receive a detection signal in response to an ESD event being detected, a second terminal of the first transistor is coupled to a control terminal of the third transistor, and a control terminal of the second transistor is configured to receive the logic control signal.

20 Claims, 13 Drawing Sheets

(58) Field of Classification Search
USPC .......................................................... 361/56
See application file for complete search history.

(56) References Cited

U.S. PATENT DOCUMENTS

| | | | | | |
|---|---|---|---|---|---|
| 5,994,955 | A * | 11/1999 | Birkeland | ................ | H03F 3/68 |
| | | | | | 330/51 |
| 6,201,428 | B1 * | 3/2001 | Clark | .............. | H03K 19/00315 |
| | | | | | 327/333 |
| 6,294,943 | B1 * | 9/2001 | Wall | ................ | H03K 19/00315 |
| | | | | | 327/543 |
| 6,323,675 | B1 * | 11/2001 | Whitworth | .......... | H04L 25/0298 |
| | | | | | 327/321 |
| 6,329,837 | B1 * | 12/2001 | Whitworth | .......... | H04L 25/0278 |
| | | | | | 327/321 |
| 6,426,854 | B1 * | 7/2002 | Allen | .............. | H03K 19/00315 |
| | | | | | 327/321 |
| 6,898,062 | B2 * | 5/2005 | Russ | .................. | H01L 27/0266 |
| | | | | | 361/111 |
| 7,986,171 | B2 * | 7/2011 | Wang | ................ | H03K 19/0013 |
| | | | | | 327/108 |
| 8,860,497 | B1 * | 10/2014 | Pattnayak | .......... | H03K 17/0822 |
| | | | | | 327/108 |
| 9,425,793 | B2 * | 8/2016 | Park | ............... | H03K 19/017509 |
| 10,224,817 | B1 * | 3/2019 | Sharma | ............... | H02M 3/1588 |
| 10,332,871 | B2 | 6/2019 | Russ et al. | | |
| 10,644,701 | B1 * | 5/2020 | Su | ........................ | H03K 19/007 |
| 11,056,880 | B1 * | 7/2021 | Mathur | .................. | H02H 9/046 |
| 11,101,799 | B2 * | 8/2021 | Lee | .................. | H03K 19/00315 |
| 2002/0105766 | A1 * | 8/2002 | Lin | ..................... | H01L 27/0285 |
| | | | | | 361/56 |
| 2004/0080889 | A1 * | 4/2004 | Woo | ................ | H03K 19/00315 |
| | | | | | 361/90 |
| 2010/0097117 | A1 * | 4/2010 | Wang | ................ | H03K 19/0013 |
| | | | | | 327/333 |
| 2013/0063844 | A1 * | 3/2013 | Sun | ..................... | H01L 27/0285 |
| | | | | | 361/56 |
| 2014/0029143 | A1 * | 1/2014 | Lim | ....................... | H03F 1/523 |
| | | | | | 330/261 |
| 2015/0245546 | A1 | 8/2015 | Lin | | |
| 2015/0333508 | A1 | 11/2015 | Ko et al. | | |
| 2016/0156177 | A1 | 6/2016 | Lin | | |
| 2016/0164515 | A1 * | 6/2016 | Goel | .................... | H03K 17/687 |
| | | | | | 327/434 |
| 2018/0151240 | A1 * | 5/2018 | Zhou | ...................... | G11C 17/16 |
| 2018/0158533 | A1 * | 6/2018 | Zhou | ...................... | G11C 17/18 |

* cited by examiner

DEVICE AND METHOD FOR OPERATING THE SAME

PRIORITY CLAIM AND CROSS-REFERENCE

This application is a continuation of U.S. application Ser. No. 16/936,236, filed Jul. 22, 2020, now U.S. Pat. No. 11,355,927, issued Jun. 7, 2022, which are herein incorporated by reference.

BACKGROUND

As semiconductor manufacturing process develops, electrostatic discharge (ESD) protection becomes one of the most critical reliability issues for integrated circuits (IC). Generally, an ESD device includes an ESD current path, and/or control circuits (i.e., switches, pull-up circuits, and/or pull-down circuits). However, the control circuits are not controlled during ESD events properly.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
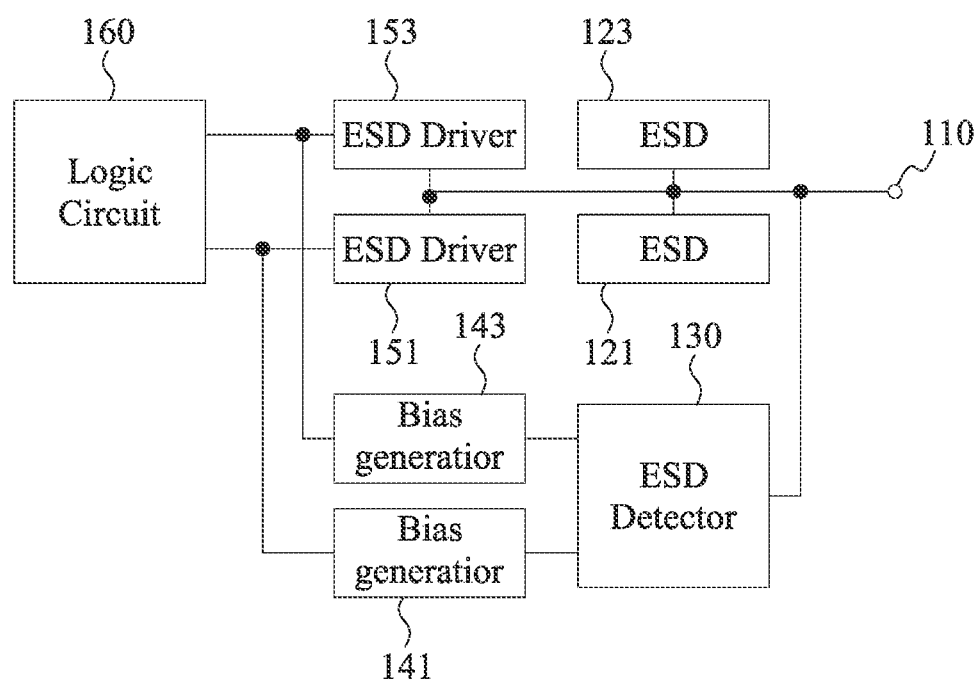
FIG. 1 is a schematic diagram of a device, in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Reference is now made to FIG. 1. FIG. 1 is a schematic diagram of a device, in accordance with various embodiments of the present disclosure.

As illustratively shown in FIG. 1, the device 100 includes a pad 110, electrostatic discharge (ESD) protection circuits 121, 123, an electrostatic discharge (ESD) detector 130, bias generators 141, 143, ESD drivers 151, 152, and a logic circuit 160.

The terms "comprise," "comprising," "include," "including," "has," "having," etc. used in this specification are open-ended and mean "comprises but not limited." The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In some embodiments, reference is now made to the device 100 shown in FIG. 1. The ESD protection circuits 121, 123 are coupled to the pad 110. The ESD detector 130 is coupled to the pad 110. The bias generators 141, 143 are coupled to the ESD detector 130 and the ESD drivers 151, 152. The ESD drivers 151, 152 are coupled to the pad 110 and the ESD protection circuits 121, 123. The logic circuit 160 is coupled to the bias generators 141, 143 and the ESD drivers 151, 152.

The above discussion merely describes exemplary connections that can be made in accordance with various alternative embodiments. It is understood that such various alternative embodiments are not limited to the specific connections described above or those shown in FIG. 1.

As illustratively shown in FIG. 1, the pad 110 is configured to receive an input signal. In some embodiments, the pad 110 includes an Input/Output (I/O) pad. The I/O pad receives input current or input voltage. The ESD detector 130 is configured to detect the input signal, and generate a detection signal in response to an ESD event being detected. In some embodiments, when an ESD event occurs, an overcurrent and an overvoltage are detected by the ESD detector 130. The ESD detector 130 therefore generates a detection signal. The bias generators 141, 143 are configured to generate bias signals according to the detection signal generated by the ESD detector 130.

Each of the ESD drivers 151, 153 includes at least two transistors, and the at least two transistors in each of the ESD drivers 151, 153 are coupled to each other in series. The at least two transistors in each of the ESD drivers 151, 153 are turned off according to the bias signals generated by the bias generators 141, 143 and a logic control signal generated by the logic circuit 160. The input signal is therefore applied across the at least two transistors in each of the ESD drivers 151, 153.

In some embodiments, when an ESD event occurs, an overvoltage inputs into the pad 110. Meanwhile, the at least two transistors in each of the ESD drivers 151, 153 are turned off according to the bias signals generated by the bias generators 141, 143 and the logic control signal generated by the logic circuit 160. Therefore, the overvoltage is applied across the at least two transistors in each of the ESD drivers 151, 153, and the at least two transistors in each of the ESD drivers 151, 153 share the overvoltage equally.

In some embodiments, when an ESD event occurs and an overvoltage inputs into the pad 110, the logic circuit 160 may not properly control the at least two transistors in each of the ESD drivers 151, 153. In the above-mentioned condition, if one of the at least two transistors is not fully turned off by the logic circuit 160, the overvoltage is mainly applied across the other one of the at least two transistors. As such, the other one of the at least two transistors is damaged easily due to the overvoltage mainly dropping on it.

As illustratively shown in FIG. 1, the bias generators 141, 143 generate the bias signal for assisting turning off the at least two transistors in each of the ESD drivers 151, 153. Since the at least two transistors in each of the ESD drivers 151, 153 are all turned off during the occurrence of an ESD event, the overvoltage is applied to both of the at least two transistors in each of the ESD drivers 151, 153 so that the at least two transistors in each of the ESD drivers 151, 153 share the overvoltage equally to prevent them from being damaged.

Figure 2:
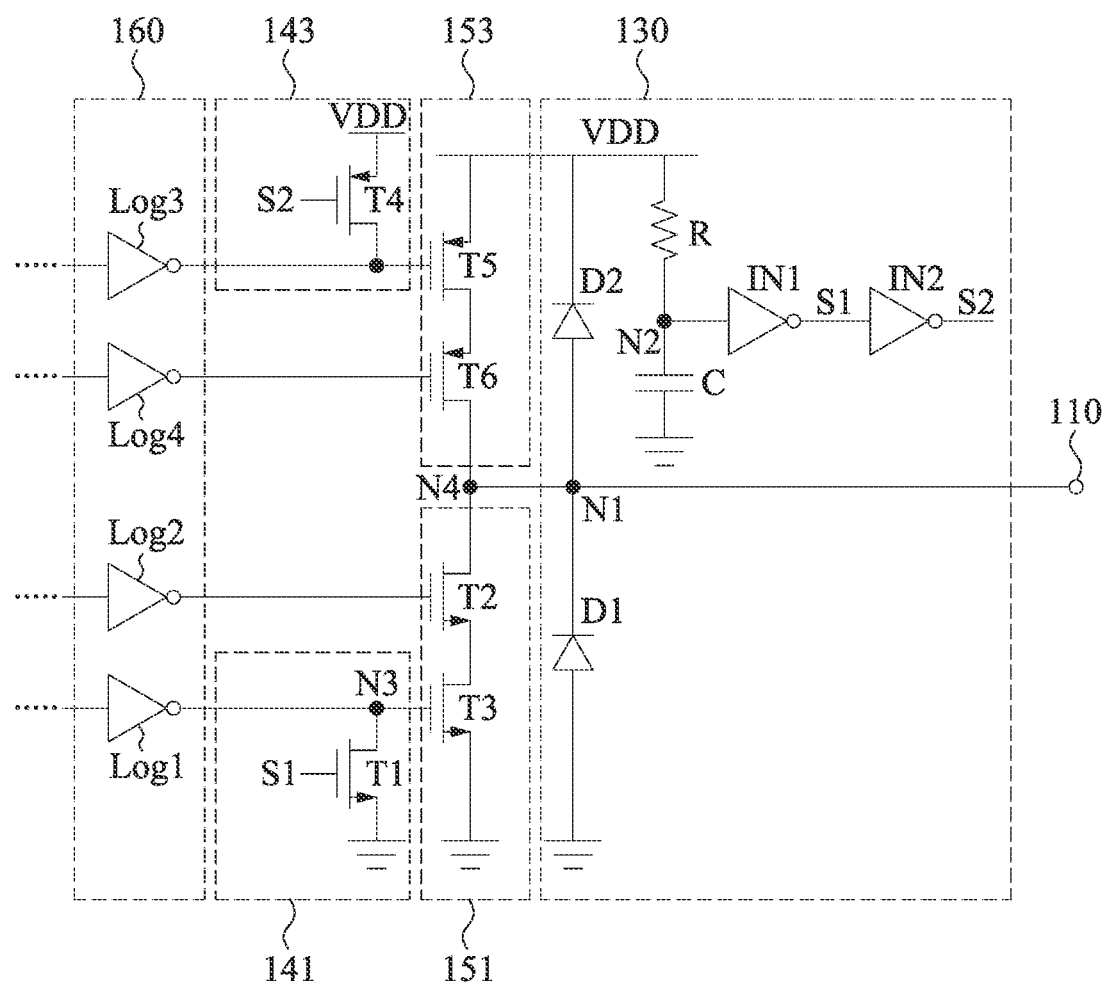
FIG. 2 is a circuit diagram of the device as shown in FIG. 1, in accordance with various embodiments of the present disclosure.

Reference is now made to FIG. 2. FIG. 2 is a circuit diagram of the device as shown in FIG. 1, in accordance with various embodiments of the present disclosure.

As illustratively shown in FIG. 2, the ESD detector 130 includes a diode D1, a diode D2, a resistor R1, a capacitor C1, an inverter IN1, and an inverter IN2. The anode of the diode D1 is grounded. The cathode of the diode D1 and the anode of the diode D2 are coupled at a node N1, and the node N1 is coupled to the pad 110. The cathode of the diode D2 is coupled to one terminal of the resistor R1. The other terminal of resistor R1 and one terminal of the capacitor C1 are coupled to a node N2. The input terminal of the inverter IN1 is coupled to the node N2, and the output terminal of the inverter IN1 is coupled to the input terminal of the inverter IN2.

Reference is now made to FIG. 2. The bias generator 141 includes a transistor T1. The ESD driver 151 includes at least two transistors T2, T3. The logic circuit 160 includes logic gates Log1-Log4. The first terminal of the transistor T1 is grounded, the control terminal of the transistor T1 is configured to receive the detection signal S1, and the second terminal of the transistor T1 is coupled to the control terminal of the transistor T3 and the logic gate Log 1 at a node N3. The first terminal of the transistor T3 is grounded, and the second terminal of the transistor T3 is coupled to the first terminal of the transistor T2. The second terminal of the transistor T2 is coupled to a node N4, and the control terminal of the transistor T2 is coupled to the logic gate Log2. As illustratively shown in FIG. 2, the transistor T2 and the transistor T3 are coupled to each other in series.

The above discussion merely describes exemplary connections that can be made in accordance with various alternative embodiments. It is understood that such various alternative embodiments are not limited to the specific connections described above or those shown in FIG. 2.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

When an ESD event occurs, an overvoltage inputs into the pad 110. The node N1 of the ESD detector 130 receives the overvoltage from the pad 110, and the inverter IN1 of the ESD detector 130 outputs the detection signal S1 with high level accordingly. The inverter IN2 receives and inverts the detection signal S1 with high level so as to output the detection signal S2 with low level. Meanwhile, the logic gates Log1-Log2 of the logic circuit 160 output logic signals with low level to turn off the transistors T2, T3. Furthermore, the transistor T1 receives the detection signal S1 with high level, and the transistor T1 is therefore turned on for pulling down the voltage at the node N3 to ground such that the transistor T3 is fully turned off.

In view of the above, when an ESD occurs, both of the transistors T2, T3 in the ESD driver 151 are turned off. The overvoltage is applied to both of the transistors T2, T3 in the ESD driver 151 so that the transistors T2, T3 in the ESD driver 151 share the overvoltage equally to prevent them from being damaged.

As illustratively shown in FIG. 2, the bias generator 143 includes a transistor T4. The ESD driver 153 includes at least two transistors T5, T6. The first terminal of the transistor T4 is configured to receive a power supply voltage VDD, the control terminal of the transistor T4 is configured to receive the detection signal S2, and the second terminal of the transistor T4 is coupled to the control terminal of the transistor T5 and the logic gate Log 3 at a node N5. The first terminal of the transistor T5 is configured to receive the power supply voltage VDD, and the second terminal of the transistor T5 is coupled to the first terminal of the transistor T6. The second terminal of the transistor T6 is coupled to the node N4, and the control terminal of the transistor T6 is coupled to the logic gate Log4. As illustratively shown in FIG. 2, the transistor T5 and the transistor T6 are coupled to each other in series.

When an ESD event occurs, an overvoltage inputs into the pad 110. The node N1 of the ESD detector 130 receives the overvoltage from the pad 110, and the inverter IN1 of the ESD detector 130 outputs the detection signal S1 with high level accordingly. The inverter IN2 receives and inverts the detection signal S1 with high level so as to output the detection signal S2 with low level. Meanwhile, the logic gates Log3, Log4 of the logic circuit 160 output logic signals with high level to turn off the transistors T5, T6. Furthermore, the transistor T4 receives the detection signal S2 with low level, and the transistor T4 is therefore turned on to pull up the voltage at the node N5 to the power supply voltage VDD such that the transistor T5 is fully turned off.

In view of the above, when an ESD occurs, both of the transistors T5, T6 in the ESD driver 153 are turned off. The overvoltage is applied to both of the transistors T5, T6 in the ESD driver 153 so that the transistors T5, T6 in the ESD driver 153 share the overvoltage equally to prevent them from being damaged.

Figure 3:
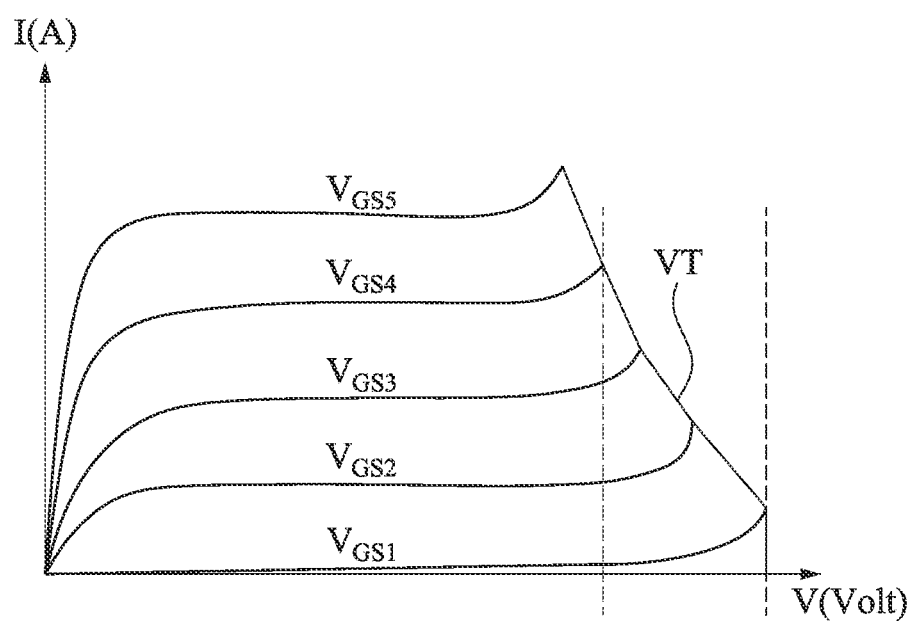
FIG. 3 is a V-I curve diagram of a threshold of transistor in the device as shown in FIG. 2, in accordance with various embodiments of the present disclosure.

Reference is now made to FIG. 3. FIG. 3 is a V-I diagram of the transistor in the device as shown in FIG. 2, in accordance with various embodiments of the present disclosure.

As illustratively shown in FIG. 3, it shows V-I curve of one of the transistors T1-T6 in the device 100 as shown in FIG. 2 at different gate bias $V_{GS}$, and the gate bias $V_{GS}$ increases from $V_{GS1}$ to $V_{GS5}$. As can be seen in FIG. 3, there is a threshold line VT, and an area which is under the threshold line VT is a safe operating area (SOA). In other words, if one of the transistors T1-T6 in the device 100 as shown in FIG. 2 operates in the SOA, the transistor will not be damaged. On the contrary, if the current or the voltage of the transistor is not within the SOA, the transistor will be damaged permanently.

Reference is now made to both of FIG. 2 and FIG. 3. When an ESD event occurs, the overvoltage is mainly applied to the transistor T2 if the transistors T2, T3 are not controlled properly such that the transistor T2 will be damaged by the overvoltage due to the overvoltage being larger than the threshold voltage of the transistor T2. In some embodiments, when an ESD event occurs, the bias generator 141 generates the bias signal for assisting turning off the transistor T3 in the ESD driver 151. Since both of the transistors T2, T3 in the ESD driver 151 are turned off during the occurrence of the ESD event, the overvoltage is applied to both of the transistors T2, T3 in the ESD driver 151 such that the transistors T2, T3 in the ESD driver 151 share the overvoltage equally. In such condition, the overall threshold voltage in the ESD driver 151 becomes higher because both of the threshold voltages of the transistors T2, T3 are used against the overvoltage. Therefore, owing to the assistance of the bias generator 141, the overall threshold voltage in the ESD driver 151 becomes higher so as to prevent the transistors T2, T3 from being damaged.

In some embodiments, when an ESD event occurs, the overvoltage is mainly applied to the transistor T6 if the transistors T5, T6 are not controlled properly such that the transistor T6 will be damaged by the overvoltage due to the overvoltage being larger than the threshold voltage of the transistor T6. In some embodiments, when an ESD event occurs, the bias generator 143 generates the bias signal for assisting turning off the transistor T5 in the ESD driver 153. Since both of the transistors T5, T6 in the ESD driver 153 are turned off during the occurrence of the ESD event, the overvoltage is applied to both of the transistors T5, T6 in the ESD driver 153 such that the transistors T5, T6 in the ESD driver 153 share the overvoltage equally. In such condition, the overall threshold voltage in the ESD driver 153 becomes higher because both of the threshold voltages of the transistors T5, T6 are used against the overvoltage. Therefore, owing to the assistance of the bias generator 143, the overall threshold voltage in the ESD driver 153 becomes higher so as to prevent the transistors T5, T6 from being damaged.

Figure 4:
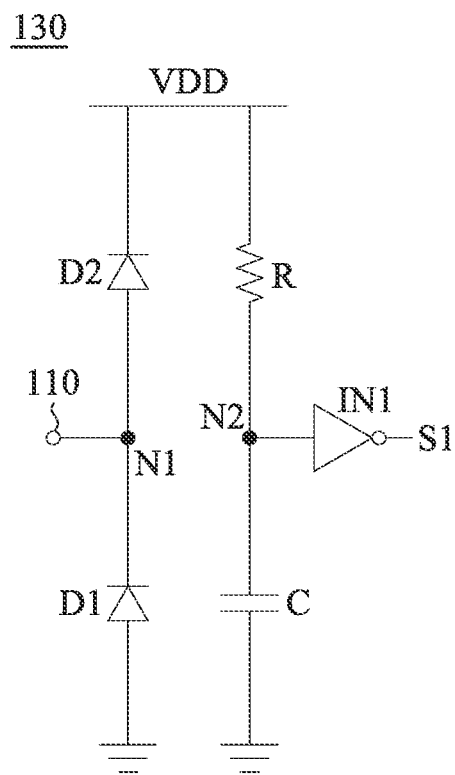
FIG. 4 is a circuit diagram of the device as shown in FIG. 1, in accordance with various embodiments of the present disclosure.
Figure 5:
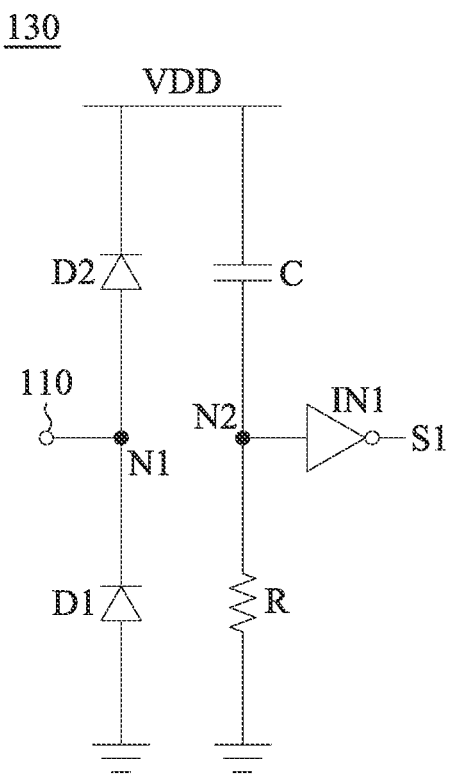
FIG. 5 is a circuit diagram of the device as shown in FIG. 1, in accordance with various embodiments of the present disclosure.

Reference is now made to FIG. 4 and FIG. 5. FIG. 4 is a circuit diagram of the device as shown in FIG. 1, in accordance with various embodiments of the present disclosure. FIG. 5 is a circuit diagram of the device as shown in FIG. 1, in accordance with various embodiments of the present disclosure.

As illustratively shown in FIG. 4 and FIG. 5, the ESD detector 130 is implemented by two diodes D1, D2, a resistor R, a capacitor C, and at least one inverter IN1. Reference is now made to FIG. 4. The anode of the diode D1 is grounded. The cathode of the diode D1 and the anode of the diode D2 are coupled at a node N1, and the node N1 is coupled to the pad 110. The cathode of the diode D2 is coupled to one terminal of the resistor R and configured to receive a power supply voltage VDD. The other terminal of the resistor R and one terminal of the capacitor C are coupled to a node N2. The input terminal of the inverter IN1 is coupled to the node N2, and the output terminal of the inverter IN1 is configured to output a detection signal S1.

Reference is now made to FIG. 5. The anode of the diode D1 is grounded. The cathode of the diode D1 and the anode of the diode D2 are coupled at a node N1, and the node N1 is coupled to the pad 110. The cathode of the diode D2 is coupled to one terminal of the capacitor C and configured to receive a power supply voltage VDD. The other terminal of the capacitor C and one terminal of the resistor R are coupled to a node N2. The input terminal of the inverter IN1 is coupled to the node N2, and the output terminal of the inverter IN1 is configured to output a detection signal S1.

Figure 6:
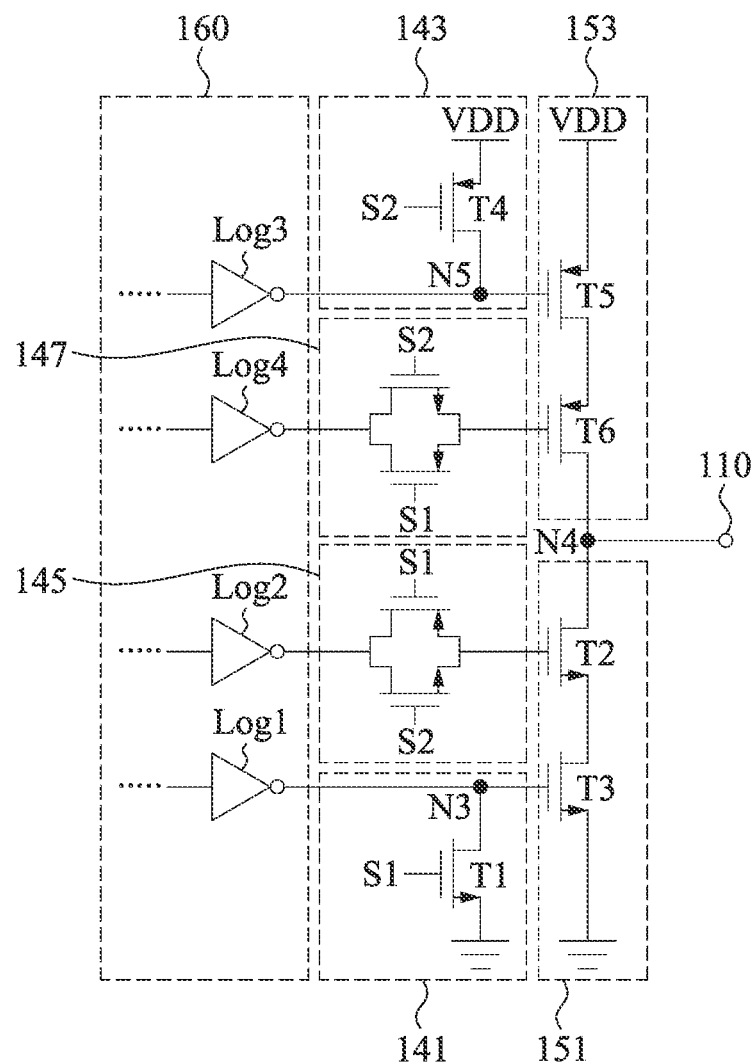
FIG. 6 is a circuit diagram of the device as shown in FIG. 1, in accordance with various embodiments of the present disclosure.

Reference is now made to FIG. 6. FIG. 6 is a circuit diagram of the device as shown in FIG. 1, in accordance with various embodiments of the present disclosure. Compared with the device 100 in FIG. 2, the device 100A in FIG. 6 further includes transmission gates 145, 147. The first terminal of the transmission gate 145 is coupled to the logic gate Log2, the control terminals of the transmission gate 145 receive a detection signal S1 and a detection signal S2 respectively, and the second terminal of the transmission gate 145 is coupled to the control terminal of the transistor T2. The first terminal of the transmission gate 145 receives the logic signal from the logic gate Log2, and provides the logic signal to the transistor T2. The first terminal of the transmission gate 147 is coupled to the logic gate Log4, the control terminals of the transmission gate 147 receive the detection signal S1 and the detection signal S2 respectively, and the second terminal of the transmission gate 147 is coupled to the control terminal of the transistor T6. The first terminal of the transmission gate 147 receives the logic signal from the logic gate Log4, and provides the logic signal to the transistor T6. It is noted that the ESD detector 130 in FIG. 2 is omitted herein for the sake of brevity.

When an ESD event occurs, the bias generator 141 is turned on in response to the detection signal S1, and configured to pull down the voltage at the node N3 for assisting turning off the transistor T3 in the ESD driver 151. Moreover, the transmission gate 145 is turned off in response to the detection signals S1, S2, and configured to cut a current path from the logic gate Log2 to the control terminal of the transistor T2 for assisting turning off the transistor T2 in the ESD driver 151. Similarly, the transistors T5, T6 in the ESD driver 153 are all turned off by the assistance of the bias generator 143 and the transmission gate 147.

Owing to the assistance of the bias generators 141, 143, the transistors T3, T5 are controlled properly. In the embodiment of FIG. 6, the transmission gates 145, 147 of the device 100A in FIG. 6 further assist with controlling the transistors T2, T6. Therefore, when an ESD event occurs, the transistors T2, T3 in the ESD driver 151 and the transistors T5, T6 in the ESD driver 153 are controlled properly. Hence, the transistors T2, T3 in the ESD driver 151 and the transistors T5, T6 in the ESD driver 153 are all turned off, and the overall threshold voltages in the ESD drivers 151, 153 become higher so as to prevent the transistors T2, T3, T5, T6 from being damaged.

The above discussion merely describes exemplary connections that can be made in accordance with various alternative embodiments. It is understood that such various alternative embodiments are not limited to the specific connections described above or those shown in FIG. 6.

Figure 7:
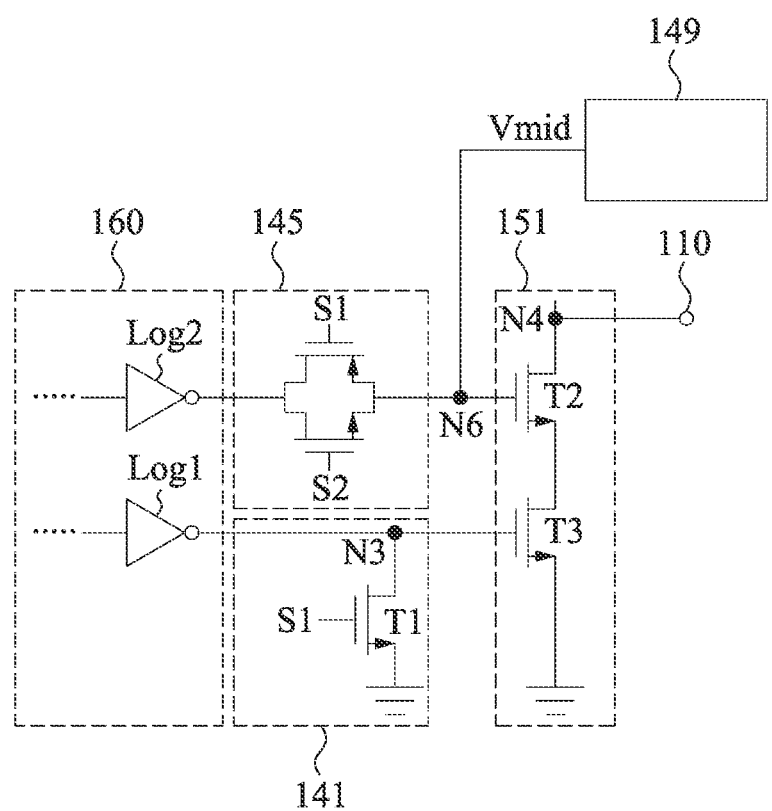
FIG. 7 is a circuit diagram of the device as shown in FIG. 1, in accordance with various embodiments of the present disclosure.

Reference is now made to FIG. 7. FIG. 7 is a circuit diagram of the device as shown in FIG. 1, in accordance with various embodiments of the present disclosure. Compared with the device 100 in FIG. 2, the device 100B in FIG. 7 further includes a secondary bias generator 149. The secondary bias generator 149 provides a secondary bias signal Vmid to the transistor T2 in response to an ESD event being detected. In view of the above, the secondary bias generator 149 provides the secondary bias signal Vmid more precisely to distribute the voltage drop equally on the transistors T2, T3 in the ESD driver 151 during an occurrence of an ESD event. In other words, the voltage drop on the transistor T2 in the ESD driver 151 and the voltage drop on the transistor T3 in the ESD driver 151 are substantially the same. In some embodiments, the term "substantially the same" means that the voltage difference between the voltage drops is less than 20% of the greater/smaller voltage value. It is noted that the ESD detector 130 in FIG. 2 is omitted herein for the sake of brevity. In addition, the secondary bias generator 149 may also provide the secondary bias signal Vmid more precisely to distribute the voltage drop equally on the transistors T5, T6 in the ESD driver 153 shown in FIG. 2 during an occurrence of an ESD event. Hence, the voltage drop on the transistor T5 in the ESD driver 153 and the voltage drop on the transistor T6 in the ESD driver 153 shown in FIG. 2 are substantially the same.

The above discussion merely describes exemplary connections that can be made in accordance with various alternative embodiments. It is understood that such various alternative embodiments are not limited to the specific connections described above or those shown in FIG. 7.

Figure 8:
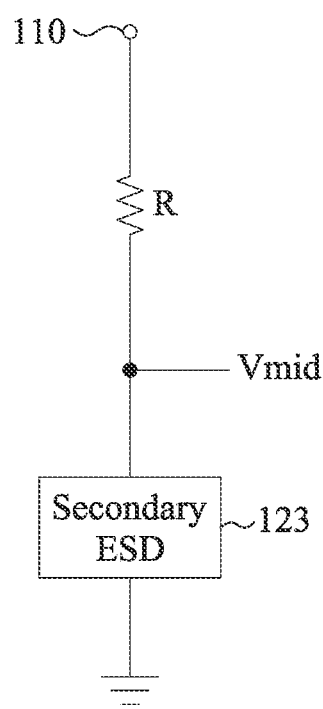
FIG. 8 is a circuit diagram of the device as shown in FIG. 7, in accordance with various embodiments of the present disclosure.

Reference is now made to FIG. 8. FIG. 8 is a circuit diagram of the device as shown in FIG. 7, in accordance with various embodiments of the present disclosure. As illustratively shown in FIG. 8, the secondary bias generator 149 includes a resistor R, and a secondary ESD 123. When an ESD event occurs, the secondary ESD 123 is turned on and an overvoltage inputs from the pad 110, and a bias such as the secondary bias signal Vmid will be generated.

Figure 9:
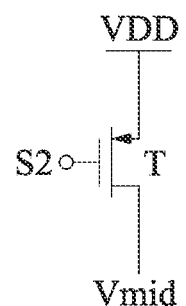
FIG. 9 is a circuit diagram of the device as shown in FIG. 7, in accordance with various embodiments of the present disclosure.

Reference is now made to FIG. 9. FIG. 9 is a circuit diagram of the device as shown in FIG. 7, in accordance with various embodiments of the present disclosure. As illustratively shown in FIG. 9, the secondary bias generator 149 includes a transistor T. When an ESD event occurs, the transistor T is turned on in response to a detection signal S2 with low level, and the secondary bias signal Vmid will be generated.

The above discussion merely describes exemplary connections that can be made in accordance with various alternative embodiments. It is understood that such various alternative embodiments are not limited to the specific connections described above or those shown in FIG. 8, FIG. 9.

Figure 10:
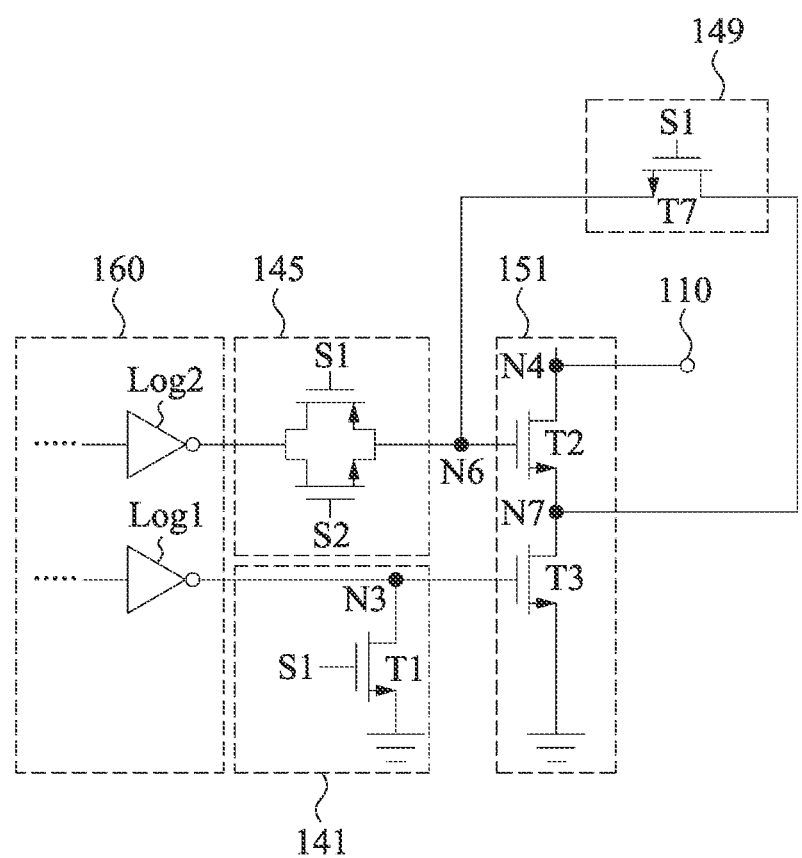
FIG. 10 is a circuit diagram of the device as shown in FIG. 1, in accordance with various embodiments of the present disclosure.

Reference is now made to FIG. 10. FIG. 10 is a circuit diagram of the device as shown in FIG. 1, in accordance with various embodiments of the present disclosure. As illustratively shown in FIG. 10, the secondary bias generator 149 includes a transistor T7. The first terminal of the transistor T7 is coupled to the control terminal of the transistor T2 and the transmission gate 145 at a node N6. The control terminal of the transistor T7 is configured to receive a detection signal S1. The second terminal of the transistor T7 is coupled to the transistor T2 and the transistor T3 at a node N7.

When an ESD occurs, the transistor T7 is turned on, and the transistor T7 transmits the voltage at the node N7 to the node N6 such that the transistors T2, T3 may be controlled properly, and the transistor T7 may distribute the voltage drop on the transistors T2, T3 in the ESD driver 151 equally.

Figure 11:
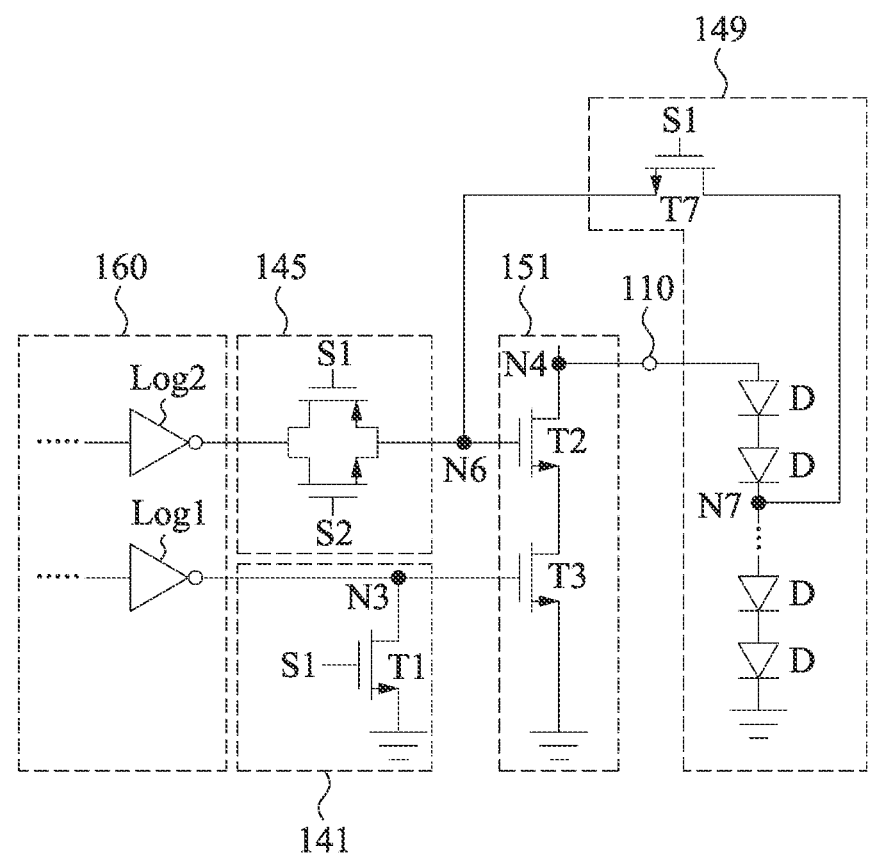
FIG. 11 is a circuit diagram of the device as shown in FIG. 1, in accordance with various embodiments of the present disclosure.

Reference is now made to FIG. 11. FIG. 11 is a circuit diagram of the device as shown in FIG. 1, in accordance with various embodiments of the present disclosure. As illustratively shown in FIG. 11, the secondary bias generator 149 includes a transistor T7, and a diode string including a plurality of diodes D. The first terminal of the transistor T7 is coupled to the control terminal of the transistor T2 and the transmission gate 145 at a node N6. The control terminal of the transistor T7 is configured to receive the detection signal S1. The second terminal of the transistor T7 is coupled to the diode string at a node N7.

When an ESD occurs, the transistor T7 is turned on, and an overvoltage inputs into the diode string. The diode string may generate a bias voltage at the node N7, and the transistor T7 transmits the bias voltage at the node N7 to the node N6 such that the transistors T2, T3 may be controlled properly, and the transistor T7 may distribute the voltage drop on the transistors T2, T3 in the ESD driver 151 equally.

Figure 12:
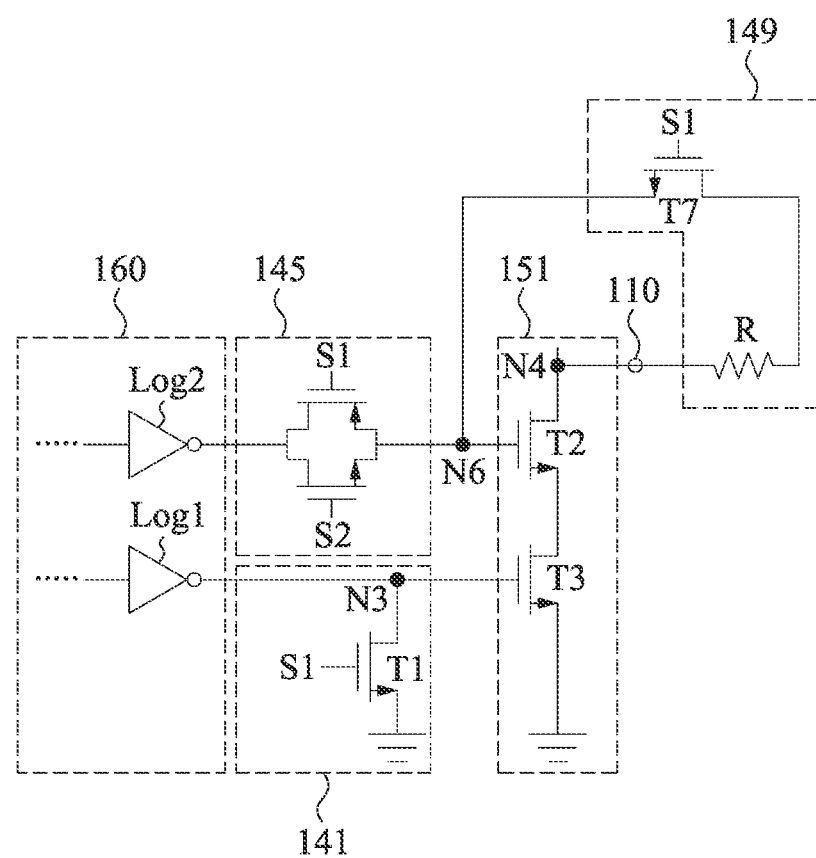
FIG. 12 is a circuit diagram of the device as shown in FIG. 1, in accordance with various embodiments of the present disclosure.

Reference is now made to FIG. 12. FIG. 12 is a circuit diagram of the device as shown in FIG. 1, in accordance with various embodiments of the present disclosure. As illustratively shown in FIG. 12, the secondary bias generator 149 includes a transistor T7, and a resistor R. The first terminal of the transistor T7 is coupled to the control terminal of the transistor T2 and the transmission gate 145 at a node N6. The control terminal of the transistor T7 is configured to receive the detection signal S1. The second terminal of the transistor T7 is coupled to one terminal of the resistor R. The other terminal of the resistor R is coupled to the pad 110.

When an ESD occurs, the transistor T7 is turned on. The overvoltage generated from the pad 110 is decreased when the overvoltage is provided through the resistor R, and the transistor T7 transmits the decreased voltage to the node N6 such that the transistors T2, T3 may be controlled properly, and the transistor T7 may distribute the voltage drop on the transistors T2, T3 in the ESD driver 151 equally.

The above discussion merely describes exemplary connections that can be made in accordance with various alternative embodiments. It is understood that such various alternative embodiments are not limited to the specific connections described above or those shown in FIG. 10, FIG. 11, and FIG. 12.

Figure 13:
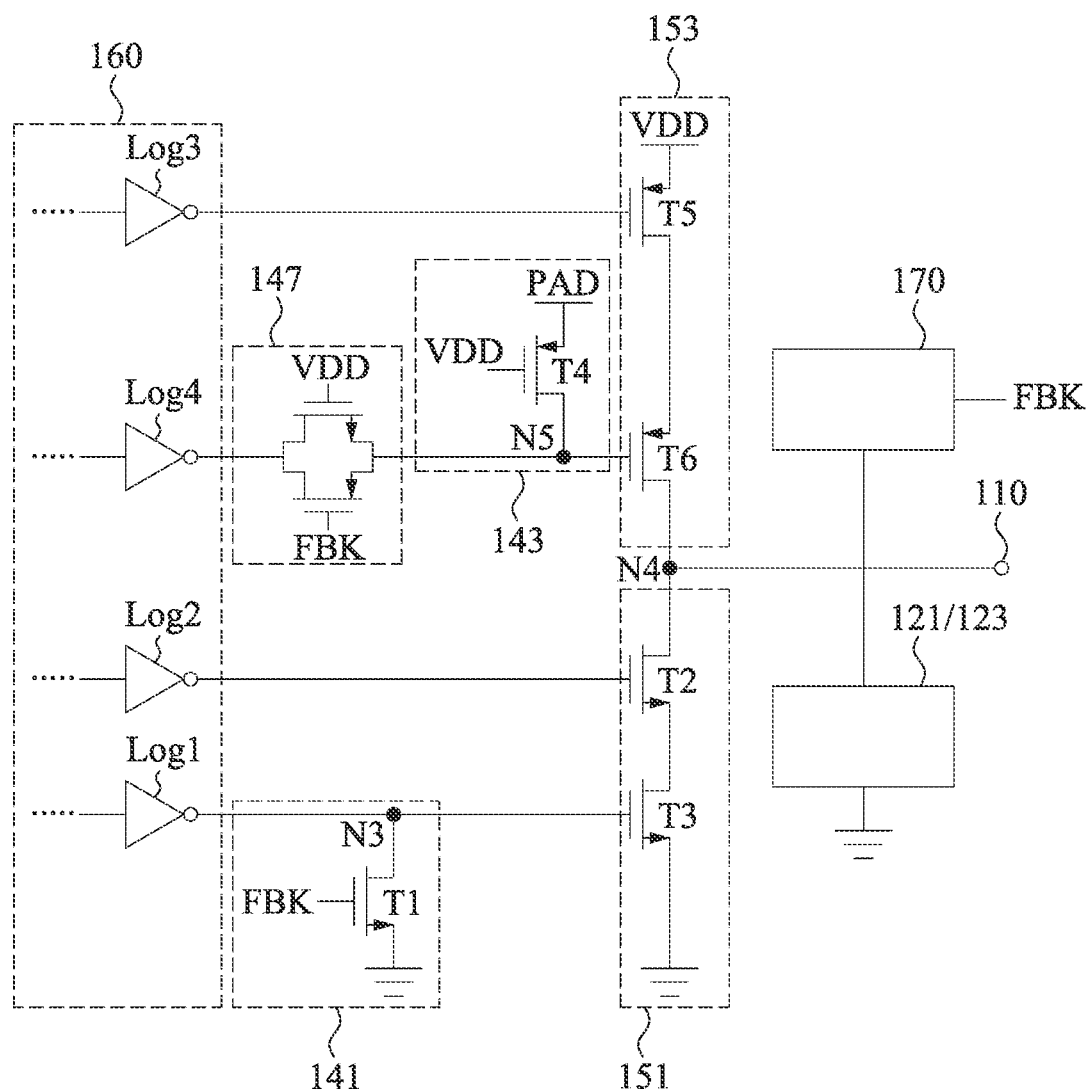
FIG. 13 is a circuit diagram of the device as shown in FIG. 1, in accordance with various embodiments of the present disclosure.

Reference is now made to FIG. 13. FIG. 13 is a circuit diagram of the device as shown in FIG. 1, in accordance with various embodiments of the present disclosure. Compared with the device 100 in FIG. 2, the device 100F in FIG. 13 further includes a transmission gate 147 and a pad tracker 170. In addition, the bias generator 143 is coupled to the transmission gate 147 and the transistor T6.

As illustratively shown in FIG. 13, the pad tracker 170 is coupled to the pad 110 and tracks the input signal from the pad 110 so as to generate a feedback signal FBK. The control terminal of the transistor T1 of the bias generator 141 receives the feedback signal FBK. The first terminal of the transmission gate 147 is coupled to the logic gate Log4, the control terminals of the transmission gate 147 receive the feedback signal FBK generated by the pad tracker 170 and a power supply voltage VDD respectively, and the second terminal of the transmission gate 147 is coupled to the control terminal of the transistor T6 at a node N5.

When an ESD event occurs, the pad tracker 170 tracks the pad 110 to generate a feedback signal FBK. The transistor T1 is therefore turned on in response to the feedback signal FBK with high level, and pulls down the voltage at node N3 to ground so as to turn off the transistor T3 in the ESD driver 151. The transmission gate 147 is also turned off in response to the feedback signal FBK with high level while the transistor T6 is turned off due to a tracking signal PAD. It is noted that the ESD detector 130 in FIG. 2 is omitted herein for the sake of brevity.

The above discussion merely describes exemplary connections that can be made in accordance with various alternative embodiments. It is understood that such various alternative embodiments are not limited to the specific connections described above or those shown in FIG. 13.

Figure 14:
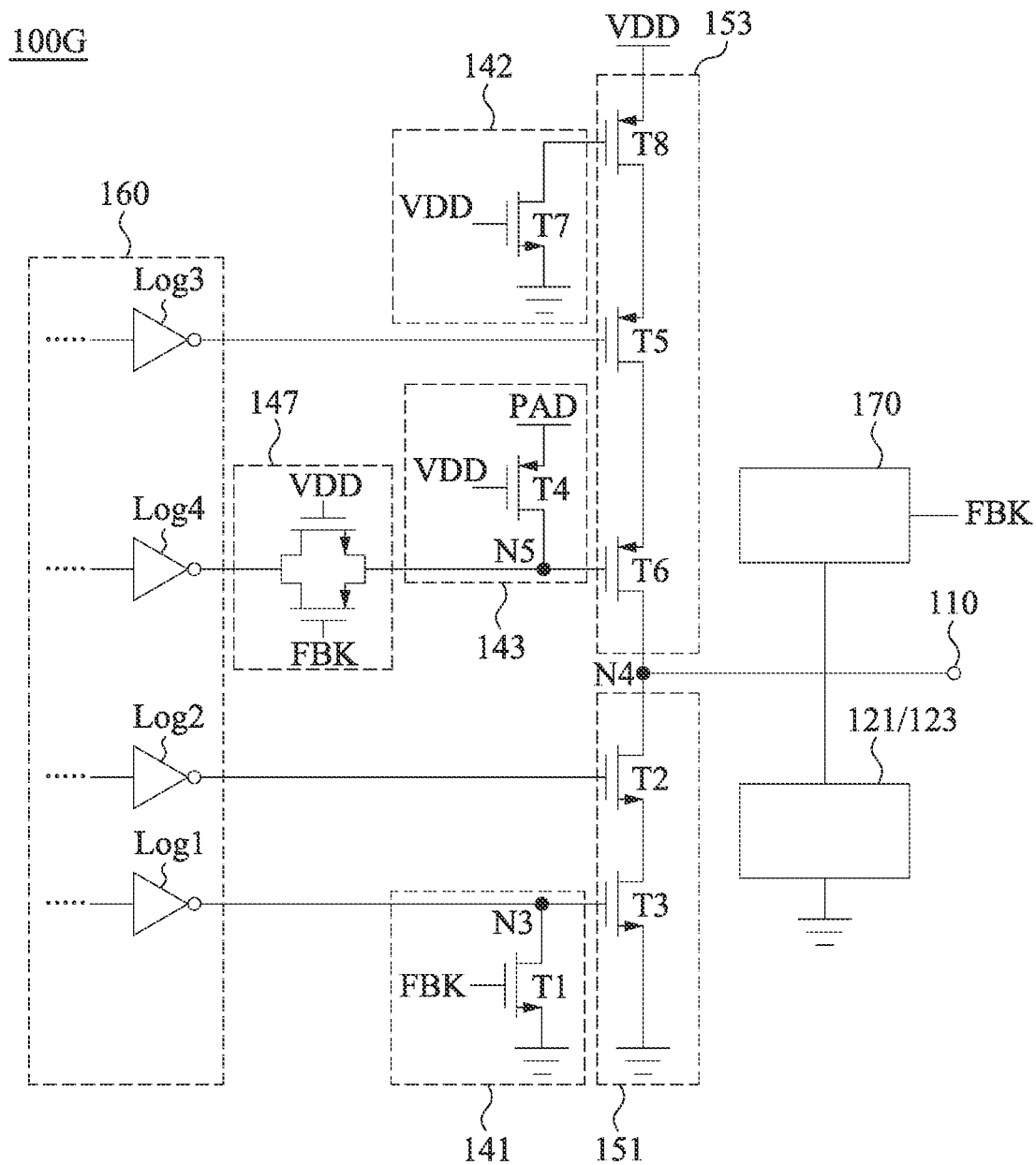
FIG. 14 is a circuit diagram of the device as shown in FIG. 1, in accordance with various embodiments of the present disclosure.

Reference is now made to FIG. 14. FIG. 14 is a circuit diagram of the device as shown in FIG. 1, in accordance with various embodiments of the present disclosure. Compared with the device 100F in FIG. 13, the device 100G in FIG. 14 further includes a bias generator 142 and a transistor T8. In addition, the bias generator 142 includes a transistor T7.

The first terminal of the transistor T7 is grounded, the control terminal of the transistor T7 is configured to receive a power supply signal VDD, and the second terminal of the transistor T7 is coupled to the control terminal of the transistor T8. The first terminal of the transistor T8 is configured to receive the power supply voltage VDD, and the second terminal of the transistor T8 is coupled to the transistor T5.

Since the device 100G in FIG. 14 further includes the transistor T8, the overall threshold voltage in the ESD driver 153 becomes higher because all of the threshold voltages of the transistors T5, T6, T8 are used against the overvoltage. It is noted that the ESD detector 130 in FIG. 2 is omitted herein for the sake of brevity.

The above discussion merely describes exemplary connections that can be made in accordance with various alternative embodiments. It is understood that such various alternative embodiments are not limited to the specific connections described above or those shown in FIG. 14.

Figure 15:
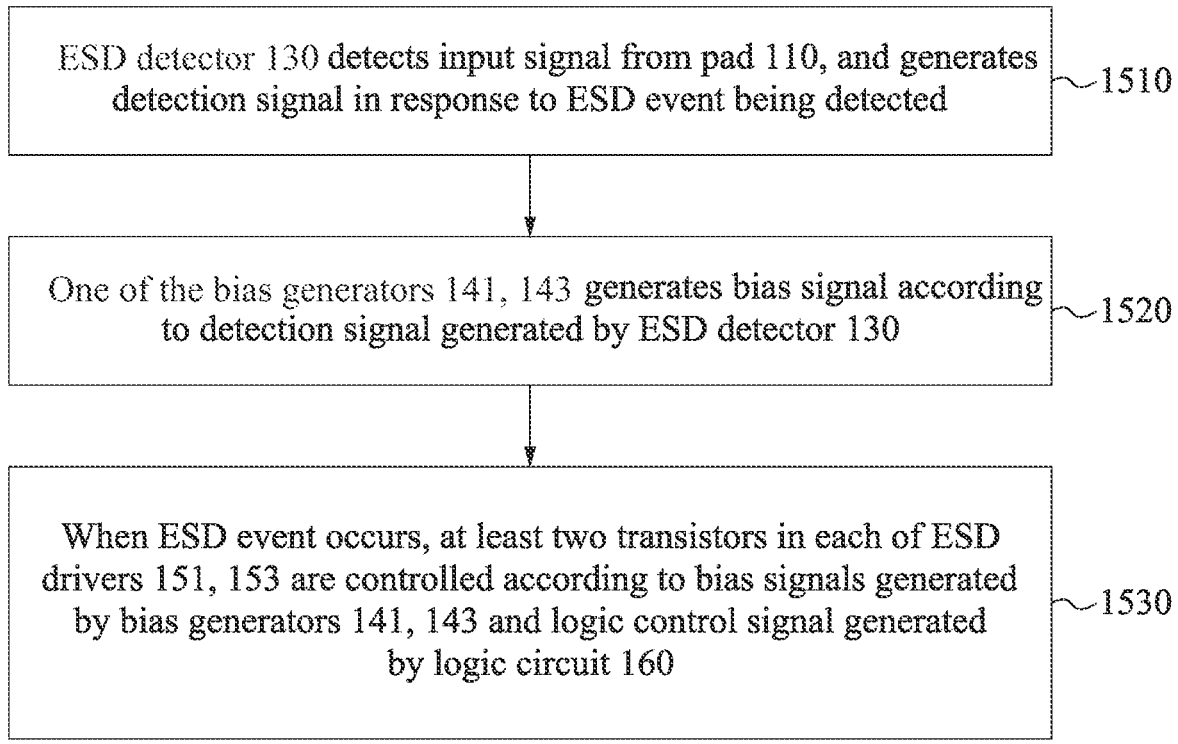
FIG. 15 is a flow chart of a method for operating the device as shown in FIG. 1 in accordance with some embodiments of the present disclosure.

Reference is now made to FIG. 15. FIG. 15 is a flow chart of a method 1500 for operating the device 100 as shown in FIG. 1 according to some embodiments of the present disclosure.

With reference to the method 1500 in FIG. 15, in operation 1510, the ESD detector 130 detects an input signal from the pad 110, and generates a detection signal in response to an ESD event being detected.

In operation 1520, one of the bias generators 141, 143 generates a bias signal according to the detection signal generated by the ESD detector 130.

In operation 1530, when an ESD event occurs, at least two transistors in each of the ESD drivers 151, 153 are controlled, for example, to turn on, according to the bias signals generated by the bias generators 141, 143 and the logic control signal generated by the logic circuit 160. With the above operation, a voltage is applied across the at least two transistors in each of the ESD drivers 151, 153, and the at least two transistors in each of the ESD drivers 151, 153 share the voltage equally.

In some embodiments, with respect to operation 1530, when an ESD event occurs, a first transistor of the at least two transistors in each of the ESD drivers 151, 153 is turned on by the logic control signal generated by the logic circuit 160, and a second transistor of the at least two transistors in each of the ESD drivers 151, 153 is turned on by the bias signals generated by the bias generators 141, 143.

In some embodiments, with respect to operation 1530 in FIG. 15 together with the device 100G in FIG. 14, when an ESD event occurs, a transistor T8 of the ESD driver 153 is turned on by the bias signal generated by the bias generators 142. The transistors T5, T6 are turned on by the logic control signal generated by the logic circuit 160 and the bias signal generated by the bias generators 143 in response to an ESD event being detected. Therefore, the input voltage from the pad 110 is applied to the transistor T5, the transistor T6, and the transistor T8 of the ESD driver 153 equally.

In some embodiments, with respect to the method 1500 in FIG. 15 together with the device 100A in FIG. 6, the method 1500 further includes providing the logic signal to the transistor T2 of the at least two transistors T2, T3 in the ESD driver 151 by the transmission gate 145. When an ESD event occurs, the method 1500 further includes stopping providing the logic signal to the transistor T2 in the ESD driver 151 by the transmission gate 145.

In some embodiments, with respect to the method 1500 in FIG. 15 together with the device 100B in FIG. 7, the method 1500 further includes providing a secondary bias signal to the transistor T2 in the ESD driver 151 by the secondary bias generator 149 in response to the ESD event being detected, so that a voltage across the transistor T2 and a voltage across the transistor T3 are substantially the same.

Also disclosed is a device. The device is disclosed herein. The device includes a bias generator, an ESD driver, and a logic circuit. The bias generator includes a first transistor. The ESD driver includes a second transistor and a third transistor coupled to each other in series. The logic circuit is configured to generate a logic control signal. A first terminal of the first transistor is configured to receive a reference voltage signal, a control terminal of the first transistor is configured to receive a detection signal in response to an ESD event being detected, a second terminal of the first transistor is coupled to a control terminal of the third transistor, and a control terminal of the second transistor is configured to receive the logic control signal.

In some embodiments, the reference voltage signal has a ground voltage or a power supply voltage.

In various embodiments, a first terminal of the second transistor is configured to receive an input signal, a second terminal of the second transistor is coupled to a first terminal of the third transistor, and a second terminal of the third transistor is configured to receive the reference voltage signal.

In some embodiments, the second transistor is controlled according to the logic control signal, and the third transistor is controlled according to the reference voltage signal, wherein a first voltage across the second transistor and a second voltage across the third transistor are substantially the same.

In various embodiments, the first transistor is configured to transmit, in response to the detection signal, the reference voltage signal as a bias signal, wherein the third transistor is controlled according to the bias signal.

In some embodiments, the input signal is applied to the second transistor and the third transistor equally.

In various embodiments, the device further includes a transmission gate. The transmission gate is configured to provide the logic control signal to the second transistor, wherein the transmission gate stops providing the logic control_signal to the second transistor in response to the ESD event being detected.

In some embodiments, the device further includes a secondary bias generator. The secondary bias generator is configured to provide a secondary bias signal to the second transistor in response to the ESD event being detected so that a first voltage across the second transistor and a second voltage across the third transistor are substantially the same.

Also disclosed is a device that includes an ESD detector, a bias generator, an ESD driver, and a transmission gate. The ESD detector is coupled to a pad, is configured to detect an input signal at the pad, and is configured to generate a detection signal in response to an ESD event being detected. The bias generator is coupled to the ESD detector and is configured to transmit a reference voltage signal according to the detection signal. The ESD driver is configured to receive the reference voltage signal and includes a plurality of transistors coupled to each other in series. The transmission gate is coupled to a first transistor of the plurality of transistors. When the ESD event occurs, the transmission gate is turned off according to the detection signal and the transmission gate stops providing a logic control signal to the first transistor.

In some embodiments, the ESD detector includes at least two diodes and a RC circuit. The at least two diodes are coupled to each other at an input terminal. The RC circuit is coupled to the at least two diodes in parallel, and includes a resistor and a capacitor. The capacitor is coupled to the resistor at an output terminal. The input terminal is configured to receive the input signal, and the output terminal is configured to generate the detection signal when the ESD event occurs.

In various embodiments, the first transistor of the plurality of transistors of the ESD driver is coupled to the pad, and a second transistor of the plurality of transistors of the ESD driver is grounded or coupled to a power supply.

In some embodiments, when the ESD event occurs, the first transistor is turned off according to the logic control signal, and the second transistor is turned off according to a bias signal so that a first voltage drop across the first transistor and a second voltage drop across the second transistor are substantially the same.

In various embodiments, the bias generator is coupled to the ESD detector and configured to transmit, in response to the detection signal, the reference voltage signal as the bias signal.

In some embodiments, the device further includes a secondary bias generator. The secondary bias generator is configured to provide a secondary bias signal to the first transistor when the ESD event occurs so that the first voltage drop across the first transistor and the second voltage drop across the second transistor are substantially the same.

Also disclosed is a method that includes the operations below: generating a detection signal in response to an ESD event being detected; generating a bias signal according to a reference voltage signal and the detection signal; controlling a first transistor of an ESD driver according to a logic control signal; and controlling a second transistor of the ESD driver according to the bias signal.

In some embodiments, a first terminal of the first transistor is configured to receive an input signal, a second terminal of the first transistor is coupled to a first terminal of the second transistor, and a second terminal of the second transistor is configured to receive the reference voltage signal.

In some embodiments, the reference voltage signal has a ground voltage or a power supply voltage.

In some embodiments, the input signal is applied to the first transistor and the second transistor equally.

In some embodiments, the method further includes the operations below: providing the logic signal to the first transistor; and stopping providing the logic signal to the first transistor in response to the ESD event being detected.

In some embodiments, the method further includes the operations below: providing a secondary bias signal to the first transistor in response to the ESD event being detected so that a first voltage across the first transistor and a second voltage across the second transistor are substantially the same.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a bias generator comprising a first transistor;
   an electrostatic discharge (ESD) driver comprising a second transistor and a third transistor coupled to each other in series; and
   a logic circuit configured to generate a logic control signal,
   wherein a first terminal of the first transistor is configured to receive a reference voltage signal, a control terminal of the first transistor is configured to receive a detection signal in response to an ESD event being detected, a second terminal of the first transistor is coupled to a control terminal of the third transistor, and a control terminal of the second transistor is configured to receive the logic control signal.

2. The device of claim 1, wherein the reference voltage signal has a ground voltage or a power supply voltage.

3. The device of claim 2, wherein a first terminal of the second transistor is configured to receive an input signal, a second terminal of the second transistor is coupled to a first terminal of the third transistor, and a second terminal of the third transistor is configured to receive the reference voltage signal.

4. The device of claim 3, wherein the second transistor is controlled according to the logic control signal, and the third transistor is controlled according to the reference voltage signal, wherein a first voltage across the second transistor and a second voltage across the third transistor are substantially the same.

5. The device of claim 4, wherein the first transistor is configured to transmit, in response to the detection signal, the reference voltage signal as a bias signal, wherein the third transistor is controlled according to the bias signal.

6. The device of claim 3, wherein the input signal is applied to the second transistor and the third transistor equally.

7. The device of claim 1, further comprising:
   a transmission gate configured to provide the logic control signal to the second transistor, wherein the transmission gate stops providing the logic control signal to the second transistor in response to the ESD event being detected.

8. The device of claim 7, further comprising:
a secondary bias generator configured to provide a secondary bias signal to the second transistor in response to the ESD event being detected so that a first voltage across the second transistor and a second voltage across the third transistor are substantially the same.

9. A device, comprising:
an ESD detector coupled to a pad, configured to detect an input signal at the pad, and configured to generate a detection signal in response to an ESD event being detected;
a bias generator coupled to the ESD detector and configured to transmit a reference voltage signal according to the detection signal;
an ESD driver configured to receive the reference voltage signal and comprising a plurality of transistors coupled to each other in series; and
a transmission gate coupled to a first transistor of the plurality of transistors,
wherein when the ESD event occurs, the transmission gate is turned off according to the detection signal and the transmission gate stops providing a logic control signal to the first transistor.

10. The device of claim 9, wherein the ESD detector comprises:
at least two diodes coupled to each other at an input terminal; and
a RC circuit coupled to the at least two diodes in parallel, comprising:
a resistor; and
a capacitor coupled to the resistor at an output terminal,
wherein the input terminal is configured to receive the input signal, and the output terminal is configured to generate the detection signal when the ESD event occurs.

11. The device of claim 10, wherein the first transistor of the plurality of transistors of the ESD driver is coupled to the pad, and a second transistor of the plurality of transistors of the ESD driver is grounded or coupled to a power supply.

12. The device of claim 11, wherein when the ESD event occurs, the first transistor is turned off according to the logic control signal, and the second transistor is turned off according to a bias signal so that a first voltage drop across the first transistor and a second voltage drop across the second transistor are substantially the same.

13. The device of claim 12, wherein the bias generator is coupled to the ESD detector and configured to transmit, in response to the detection signal, the reference voltage signal as the bias signal.

14. The device of claim 12, further comprising:
a secondary bias generator configured to provide a secondary bias signal to the first transistor when the ESD event occurs so that the first voltage drop across the first transistor and the second voltage drop across the second transistor are substantially the same.

15. A method, comprising:
generating a detection signal in response to an ESD event being detected;
generating a bias signal according to a reference voltage signal and the detection signal;
controlling a first transistor of an ESD driver according to a logic control signal; and
controlling a second transistor of the ESD driver according to the bias signal.

16. The method of claim 15, wherein a first terminal of the first transistor is configured to receive an input signal, a second terminal of the first transistor is coupled to a first terminal of the second transistor, and a second terminal of the second transistor is configured to receive the reference voltage signal.

17. The method of claim 16, wherein the reference voltage signal has a ground voltage or a power supply voltage.

18. The method of claim 16, wherein the input signal is applied to the first transistor and the second transistor equally.

19. The method of claim 15, further comprising:
providing the logic control signal to the first transistor; and
stopping providing the logic control signal to the first transistor in response to the ESD event being detected.

20. The method of claim 19, further comprising:
providing a secondary bias signal to the first transistor in response to the ESD event being detected so that a first voltage across the first transistor and a second voltage across the second transistor are substantially the same.

* * * * *